United States Patent [19]
Greenstein

[11] Patent Number: 4,757,934
[45] Date of Patent: Jul. 19, 1988

[54] LOW STRESS HEAT SINKING FOR SEMICONDUCTORS

[75] Inventor: Bernard Greenstein, Glenview, Ill.

[73] Assignee: Motorola, Inc., Schaumburg, Ill.

[21] Appl. No.: 11,670

[22] Filed: Feb. 6, 1987

[51] Int. Cl.[4] .................. B23K 31/02; B23K 35/36
[52] U.S. Cl. .................................... 228/123; 228/261;
228/263.12; 357/67; 357/71; 357/81; 427/123;
427/423
[58] Field of Search ............... 228/123, 124, 226, 261,
228/263.12, 903; 357/67, 71, 81; 427/123, 423;
65/59.1, 59.3

[56] References Cited

U.S. PATENT DOCUMENTS

| | | | |
|---|---|---|---|
| 2,662,997 | 12/1953 | Christensen | 317/239 |
| 2,763,822 | 9/1956 | Frola et al. | 317/234 |
| 2,922,092 | 1/1960 | Gazzara et al. | 317/234 |
| 3,010,057 | 11/1961 | Albert | 317/234 |
| 3,209,218 | 9/1965 | Zielasek et al. | 317/240 |
| 3,248,681 | 4/1966 | Reintgen | 338/276 |
| 3,303,432 | 2/1967 | Garfinkel et al. | 331/94.5 |
| 3,331,995 | 7/1967 | Larrison | 317/234 |
| 3,339,267 | 9/1967 | Bronnes et al. | 29/473.1 |
| 3,387,191 | 6/1968 | Fishman et al. | 317/234 |
| 3,399,332 | 8/1968 | Savolainen | 317/234 |
| 3,600,144 | 8/1971 | Csakvary | 29/195 |
| 3,839,727 | 10/1974 | Herdzik et al. | 357/71 |
| 4,074,342 | 2/1978 | Honn | 361/411 |
| 4,224,636 | 9/1980 | Yonezawa et al. | 357/54 |
| 4,542,401 | 9/1985 | Sekiba | 357/71 |

FOREIGN PATENT DOCUMENTS

647956  5/1964  France ........................... 228/261

Primary Examiner—M. Jordan
Assistant Examiner—Samuel M. Heinrich
Attorney, Agent, or Firm—John H. Moore

[57] ABSTRACT

A semiconductor die is mounted on a metal substrate via intermediate layers which permit the die to be readily soldered to the combination while yet reducing thermal stresses. A dielectric layer is formed over the substrate, followed by another layer of a selected metal, either molybdenum or tungsten. Atop the metal layer is another layer comprising a mixture of solder and the selected metal. A layer of only solder is formed over the mixture, and the semiconductor die is bonded thereto by means of the layer of solder.

7 Claims, 1 Drawing Sheet

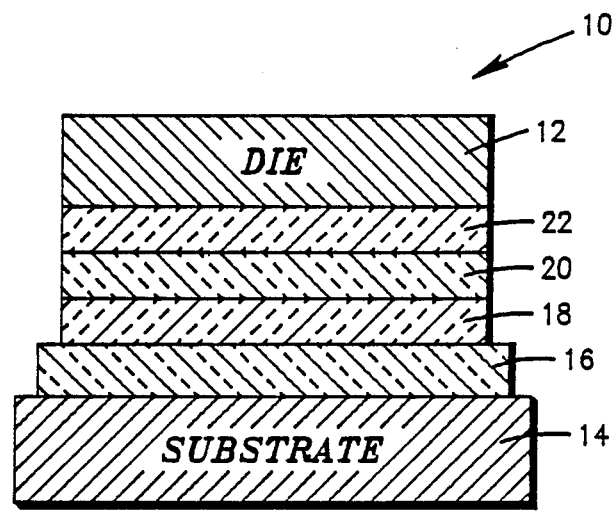

LOW STRESS HEAT SINKING FOR SEMICONDUCTORS

FIELD OF THE INVENTION

This invention pertains to heat sinking techniques for semiconductors, and particularly to techniques for soldering a semiconductor power die to a metal substrate or heat sink

BACKGROUND OF THE INVENTION

Transistor power dies are conventionally bonded to a metal substrate of aluminum, for example, by interposing, between the aluminum substrate and the die, a dielectric layer and possibly other layers of various materials. The other layers are typically selected to permit the die to be soldered to the layered stack of materials so as to maximize heat transfer between the die and the substrate without introducing materials that are incompatible with the die in terms of coefficient of expansion.

In a typical application where the metal substrate is aluminum and the dielectric consists of a layer of alumina ($AL_2O_3$) on the substrate, a metal layer of nickel or copper interposed between the silicon die and the alumina would provide a surface to which the die could be readily soldered. However, the coefficients of expansion of nickel and copper are so different from that of silicon that the thermal stresses would be unacceptable in some applications. Other metals such as molybdenum and tungsten have an acceptable coefficient of expansion and exhibit good thermal and electrical conductivity. The latter metals, however, are not readily solderable to silicon.

Various attempts have been made to find economical techniques for bonding a silicon die to an aluminum substrate while taking into account the above-mentioned characteristics of the materials. See, for example, U.S. Pat. No. 4,542,401. Nevertheless, there is still a need for a reliable and economical arrangement for heat sinking a semiconductor die to a substrate so that it can withstand the thermal extremes and other stresses which are found in harsh environments such as under-the-hood automotive applications.

Accordingly, it is a general object of the invention to provide an improved technique for bonding a semiconductor die to a metal substrate, and also to provide an improved semiconductor arrangement which is capable of withstanding relatively extreme thermal shocks.

It is another object of the invention to provide the above-mentioned improvements for a semiconductor power die so as to permit the die to be easily soldered and yet avoid the thermal stresses commonly encountered with typical solder-receptive materials.

BRIEF DESCRIPTION OF THE FIGURES

The sole FIGURE shows a semiconductor die bonded to a substrate in accordance with the invention.

DESCRIPTION OF THE PREFERRED EMBODIMENT

Referring to the FIGURE, a semiconductor/heat sink arrangement 10 is shown wherein a semiconductor die 12, such as a die for a silicon power transistor, is mounted on a substrate 14. The substrate 14 forms at least a part of a heat sink for the die 12.

As shown, the die is coupled to the substrate 14 via intermediate layers 16, 18, 20 and 22 which are selected to transfer heat from the die to the substrate, to provide a readily solderable surface to which the die can be bonded, and to reduce thermally-induced stresses while also providing electrical insulation between the die and the substrate. Preferably, all the layers 16 through 22 are deposited by using conventional plasma spray equipment.

The layer 16 constitutes a dielectric. In the preferred embodiment which uses aluminum for the substrate 14, the dielectric layer 16 is alumina which may be plasma sprayed onto the substrate to a depth of about three to ten mils, depending on the electrical properties required.

The next step in the construction of the device 10 involves a multi-layer deposition in which a layer 18 of molybdenum or tungsten is formed on the alumina layer 16. Both molybdenum and tungsten act as good heat spreaders and have coefficients of expansion which are compatible with silicon. Again, the layer 18 is preferably applied by plasma spraying.

When the desired thickness of the layer 18 has been reached (5 to 10 mils), the selected metal (molybdenum or tungsten) continues to be applied, but at a lesser rate. Added to the selected metal is solder so that a mixture of solder and the selected metal is deposited as a layer 20 onto the layer 18 of the selected metal. The thickness of the layer 20 may be from about one to four mils.

When the desired thickness of the layer 20 has been attained, the deposition of the selected metal is terminated, but the deposition of solder is continued in order to lay down a layer 22 of solder only. The layer 22 of solder may have a thickness of from about 2 mils to about 6 mils and is preferably composed of about 95% tin and 5% silver. Other high temperature solders can be used, but non-lead ones are preferred to avoid vapor toxicity problems.

The formation of layers 18, 20 and 22 may be considered as a continuous process in which the deposition of the selected metal is phased out when the layer 18 has been completed, the solder is phased in as a part of the layer 20, and the deposition of the selected metal is terminated upon the completion of the layer 20 so that only solder is being deposited during the formation of the layer 22.

The phasing in of the solder with the selected metal during the formation of the layer 20 causes the phased-in solder to be locked into a matrix with the selected metal. This improves the bonding of the solder to the selected metal and results in better thermal conductivity between the solder and the selected metal. Such improved thermal conductivity is an important factor which contributes to improved heat dissipation for the die 12.

To bond the die 12, the die may be placed on the layer 22 and then the entire device 10 may be run through a reflow oven.

The formation of the layers 18–22 may be achieved by using either two plasma guns or one plasma gun. With the two-gun approach, one gun is used to spray the selected metal (molybdenum or tungsten) uniformly over the alumina layer 16 until about 80% of the total amount to be deposited has been used. A second plasma spray gun, for the deposition of solder, is then turned on. With both guns on, the remaining 20% of the selected metal is deposited simultaneously with the solder to form the layer 20. The first gun is then turned off, and the second gun continues spraying solder to a depth of about 2 to 6 mils for the layer 22.

In the one-gun approach, the single gun has two flow inputs, one for the selected metal and one for solder. The flow input for the solder is situated farther away from the gun's nozzle than the flow input for the selected metal. This causes the solder to enter the plasma stream at a point of lower temperature than the temperature at which the selected metal enters the plasma stream. With this arrangement, the different melting points of the substances can be accounted for.

The flow input for the selected metal is activated to deposit about 80% thereof to form the layer 18. With the selected metal still being deposited, the flow input for the solder is activated to form a mixture of the selected metal and solder for the layer 20. The flow input for the selected metal is then de-activated while solder continues to be deposited to form the layer 22.

The structure which is formed as a result of the processes described above has the advantage of reduced thermal stresses while yet providing a surface to which a silicon die can be readily bonded. This is particularly important in cases where the silicon is a die for a power transistor and the device is to be used in environments which produce extreme temperature variations.

While the invention has been described in terms of a preferred embodiment, it will be obvious to those skilled in the art that many variations and alterations may be made without departing from the invention. Accordingly, it is intended that all such alterations and variations be considered as within the spirit and scope of the invention as defined by the appended claims.

I claim:

1. A method of bonding a semiconductor die to a metal substrate, comprising:
    (a) depositing a dielectric layer on the substrate;
    (b) depositing an initial layer of metal on the dielectric layer, said metal being selected from the group consisting of molybdenum and tungsten;
    (c) depositing a mixture of the selected metal, plus solder, on the initial layer;
    (d) depositing solder over the mixture; and
    (e) bonding the die to the solder.

2. A method as set forth in claim 1 wherein the metal and solder deposits recited in steps (b), (c) and (d) are effected by plasma spraying.

3. A method as set forth in claim 2 wherein steps (b), (c) and (d) are effected by plasma spraying the selected metal onto the dielectric layer, phasing in solder with the selected metal so as to spray a mixture of the selected metal and the solder, and phasing out the selected metal from the spray so that a layer of solder is deposited over the mixture.

4. A method as set forth in claim 1 or 3 wherein the dielectric layer is applied directly onto the substrate by plasma spraying.

5. A method of bonding a semiconductor die to an aluminum substrate, comprising:
    (a) plasma spraying a layer of alumina onto the substrate;
    (b) plasma spraying a deposit onto the alumina by first spraying a metal selected from the group consisting of molybdenum and tungsten, then phasing out the selected metal from the spray while phasing in solder to the spray such that a mixture of the selected metal and solder is deposited over a layer of the selected metal, and then a layer of solder is deposited over the mixture; and
    (c) bonding the die atop the layer of solder.

6. A semiconductor and heat sink arrangement comprising:
    a metal substrate forming at least part of a heat sink;
    a dielectric layer deposited on the substrate;
    a layer of metal deposited on the dielectric, said metal being selected from the group consisting of molybdenum and tungsten;
    a mixture of solder and the selected metal deposited on the layer of metal;
    a layer of solder deposited on the mixture; and
    a semiconductor die bonded atop the layer of solder.

7. An arrangement as set forth in claim 6 wherein the metal substrate is made of aluminum and wherein the dielectric layer is made of alumina.

* * * * *